Dec. 1, 1970 O. J. MARSH 3,544,398
METHOD OF PREVENTING AVALANCHING IN SEMICONDUCTOR DEVICES
Filed July 11, 1968
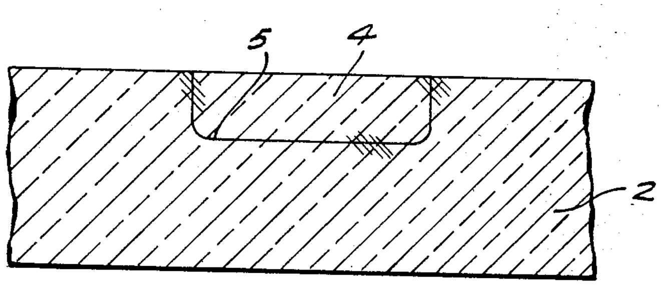
INVENTOR.
OGDEN J. MARSH,
BY
W H McAllister Jr
ATTORNEY.

United States Patent Office 3,544,398
Patented Dec. 1, 1970

3,544,398

METHOD OF PREVENTING AVALANCHING IN SEMICONDUCTOR DEVICES

Ogden J. Marsh, Woodland Hills, Calif., assignor to Hughes Aircraft Company, Culver City, Calif., a corporation of Delaware Filed July 11, 1968, Ser. No. 744,112
Int. Cl. H01l 7/54
U.S. Cl. 148—186 4 Claims

ABSTRACT OF THE DISCLOSURE

Method of preventing avalanching of a P-N junction by implanting alkali metal ions at the portions of the junction where it is desired to prevent or inhibit avalanching.

This invention relates to semiconductor devices and to methods for treating or processing semiconductor devices containing P-N junctions. More particularly, the invention relates to methods for treating selected portions of a P-N junction so as to inhibit or prevent such selected junction portions from avalanching.

There are applications for semiconductor devices where it is desired to attain substantial or significant current flow across a P-N junction upon the occurrence of some particular circumstance. There are several mechanisms available for achieving such operation. The present invention is concerned with current conduction due to the mechanism of "avalanching." In small electric fields an electron in the conduction band drifts in the direction of the field, gaining energy from the field and losing energy in collisions. Thermal equilibrium, and therefore the average energy of the electrons, is thus maintained. However, in larger electric fields the energy loss is no longer fast enough to maintain the equilibrium. Hence, the electrons acquire higher average energies and are said to be "hot" and new kinds of interactions occur (particularly optical phonon scattering, impact ionization, and pair production). Hot electrons with sufficient energy can excite additional electrons into the conduction band, either from bound states or neutral impurity atoms or from the valence band. Such additional carriers also heat up and may in turn create further carriers, the process leading to a rapid multiplication of carriers (and hence current). This process is usually termed "avalanching" or avalanche formation.

It will be appreciated that it is highly desirable to control the occurrence of the avalanching phenomenon and the ensuing current multiplication. In certain photodiodes, for example, it is desirable to obtain a sudden substantial increase in current in response to incident light. However, because the avalanching phenomenon is field-dependent, such control is difficult to achieve because of the tendency of electric fields to build up disproportionately at certain portions of a P-N junction, notably at sharp corners and at junction edges. Avalanching also occurs in the junction where defects such as diffusion spikes (which may be irregular projections of a diffused impurity region) are present. Heretofore edge breakdown has been inhibited to some extent by the use of deep diffused "guard ring" regions at peripheral portions of the junctions which are graded impurity distribution and thereby prevent the build-up of high electric fields required for avalanching. Such a guard ring structure may require repeated diffusion-masking and diffusion operations at high temperatures resulting in a degradation of the electrical properties in the semiconductor device. Such high temperature processing will also tend to drive the junction deeper into the body and perhaps beyond the desired depth. The requirement of a deep-diffused guard ring structure also mitigates against the often desired object of small device geometry since it is characteristic of the diffusion process to proceed laterally in the semiconductor body equally with vertical penetration. Heretofore there has been no known way of preventing avalanching or microplasma behavior due to defects at portions of a junction remote from such guard ring structures. In other words, prior to the present invention if avalanching could not be cured or prevented by the guard ring structure, then it could not be prevented at all and the device was either useless for its intended purposes or had to be accepted with less than optimum performance characteristics.

It is therefore an object of the present invention to provide an improved method for selectively preventing or inhibiting avalanching in a P-N junction device.

Another object of the invention is to provide an improved method for treating selected portions of a P-N junction so as to prevent or inhibit avalanching at such selected portions.

Yet another object of the invention is to provide an improved method for treating a P-N junction device so as to inhibit avalanching except where desired.

Another object of the invention is to provide an improved method for fabricating a P-N junction device whereby selected portions of the junction are inhibited from avalanching.

These and other objects and advantages of the invention are realized by treating selected portions of a P-N junction in a semiconductor body by ion implantation of alkali metals (sodium, potassium, lithium, rubidium, cesium) to thereby prevent or inhibit avalanching at such treated portions of the junction. More particularly, the method of the invention contemplates the formation of a P-N junction in a semiconductor body by conventional processes and conventional conductivity-type-determining impurities and then implanting selected portions of the junction with alkali metal ions so as to prevent or inhibit avalanching at such portions.

The invention will be described in greater detail by reference to the drawings in which the sole figure is a cross-sectional, elevational view of a portion of a semiconductor body containing a P-N junction therein.

Referring to the drawings, a portion 2 of a semiconductor device is shown. The portion 2 may comprise the bulk of the semiconductor body in which the device is formed and may be of a given conductivity type, for example P-type. Disposed in the semiconductor body 2 and adjacent one surface thereof is a region 4 of the semiconductor body of opposite conductivity type to that of the bulk region 2; for example, the region 4 may be of N-type conductivity. It will be understood that a P-N junction 5 exists between the P and N-type regions 2 and 4, respectively, and as shown the device constitutes a diode. The N-type region 4 may be formed by diffusion if desired, utilizing well-known diffusion and masking techniques for this purpose. It will also be understood that the conductivity types of the regions 2 and 4 may be reversed if desired. That is, the bulk portion 2 may be of N-type conductivity and the diode-forming region 4 may be of P-type conductivity.

According to the invention the conductivity type of the junction-forming regions 2 and 4 is determined by the incorporation therein of conventional conductivity-type-determining impurities selected from the third and fifth columns of the Periodic Table. Thus, P-type conductivity may be established by the use of boron, aluminum, gallium or indium, for example, and N-type conductivity may be established by the use of phosphorous, arsenic, or antimony. These impurities or dopants may be introduced into the crystal lattice structure of the semiconductor body by any convenient and known method such as by incorporation into melt from which the semiconductor crystal is grown, or by the well-known process of diffusion, or by the process of ion implantation. Ion implantation is a process whereby atoms of a material may be incorporated into the crystal lattice structure of a semiconductor body to any concentration level desired and to any depth desired without the necessity of utilizing high temperatures. In addition, implanted regions of any shape and area may be formed where desired in a semiconductor body.

In an ion implantation process atoms of the material to be implanted in a semiconductor body are first ionized and then formed into a stream of charged particles which may be shaped, focused, accelerated, and deflected by electric or magnetic fields. This stream or beam may thus be given any predetermined diameter and/or shape and may be caused to travel in predetermined directions at predetermined velocities. In contrast to the diffusion process where impurities are usually introduced into a semiconductor body from the vapor phase of the impurity material so as to contact and penerate the semiconductor body only in accordance with thermodynamic conditions, the ions in an ion implantation process may be made to enter the semiconductor crystal lattice in a predetermined direction at a predetermined velocity. Ions may thus be implanted and placed precisely in a semiconductor body in any prescribed concentration and to any desired degree of distribution or gradation. The implanted region may be of any lateral extent desired notwithstanding the depth of implantation.

The step of forming the P-N junction is not necessarily a step required in the process of the invention. That is, the process of the invention may be practiced to advantage on P-N junction devices which have previously been fabricated and which are later found to exhibit undesired avalanching characteristics such as premature avalanching at some portion of the junction. However, it may be exceptionally advantageous to fabricate the device entirely by ion implantation to form the P-N junction and then treat the junction in accordance with the process of the invention by further ion implantation to prevent or inhibit avalanching of the junction where desired. Thus, a P-N junction diode could be fabricated to advantage by simply placing a semiconductor body of appropriate conductivity type in an ion implantation apparatus and subjecting a selected portion of the semiconductor body to ion implantation with ions of the conductivity-type-determining impurity capable of establishing the opposite type of conductivity in the body to that of the initial or starting conductivity type. Thus, the region 4 in the device shown may be formed by ion implantation into this region of the conductivity-type-determining impurity. Thereafter, while still retaining the semiconductor body in the ion implantation apparatus, the ion source may be changed so that selected portions of the junction 5 previously formed may be treated by further implantation to inhibit or prevent avalanching.

The ion implantation treatment for inhibiting or preventing avalanching according to the invention comprises implanting a preselected portion of the junction at which it is desired to prevent avalanching with an alkali metal such as sodium, potassium, lithium, rubidium or cesium. It has been found that by forming a P-N junction with conventional dopants and then implanting the junction portion with an alkali metal it is possible to eliminate avalanching in the alkali metal implanted region. While it has heretofore been proposed that sodium ions may be implanted into P-type silicon to form an N-P junction, it has not been possible until the present invention to maintain stable avalanche conditions. The present invention thus resides in the appreciation that stable avalanching conditions may be established if conventional dopants are provided to form the P-N junction, and junction portions which exhibit unstable avalanching or other undesired microplasma behavior are implanted with an alkali metal. The process of the invention is particularly useful where it is desired to achieve avalanching at some predetermined bias condition and where the device as initially fabricated exhibits avalanching at least at some portions of the junction prematurely before such bias condition is attained. By treating such portions according to the process of the invention avalanching thereat may be prevented as long as the highest voltage applied to the device is below that at which even the alkali metal implanted areas begin to show microplasma behavior again.

The process of the invention is particularly useful for treating devices requiring pure avalanching for current multiplication such as light detectors utilizing the multiplication available when avalanching occurs or microwave generator devices which rely upon avalanching phenomena. In such devices the known electrical noise caused by unwanted or premature avalanching or microplasma behavior may be lowered or prevented altogether.

What is claimed is:

1. The method of inhibiting avalanching in a semiconductor body containing a P-N junction comprising: implanting ions of an alkali metal in said semiconductor body at selected portions of said P-N junction.

2. The method of treating selected portions of a P-N junction in a semiconductor body so as to inhibit avalanching thereat, comprising: providing a source of ions of an alkali metal, and irradiating said selected portions of said P-N junction with said ions of said alkali metal.

3. The method of fabricating a P-N junction device comprising the steps of:

(a) doping a region of a semiconductor body with a conductivity-type-determining impurity capable of establishing conductivity of opposite type to that of said semiconductor body so as to form a P-N junction in said semiconductor body;

(b) and irradiating selected portions of said P-N junction with ions of an alkali metal.

4. The method according to claim 3 wherein said region is doped by diffusing said conductivity-type-determining impurity therein.

References Cited

UNITED STATES PATENTS 3,293,084 12/1966 McCaldin ---------- 148—1.5

L. DEWAYNE RUTLEDGE, Primary Examiner

R. A. LESTER, Assistant Examiner

U.S. Cl. X.R.

29—576; 148—1.5